US 7,361,929 B2

United States Patent
Bucher et al.

(10) Patent No.: US 7,361,929 B2
(45) Date of Patent: Apr. 22, 2008

(54) FIELD-EFFECT TRANSISTORS WITH WEAKLY COUPLED LAYERED INORGANIC SEMICONDUCTORS

(75) Inventors: Ernst Bucher, Summit, NJ (US); Michael E. Gershenson, Highland Park, NJ (US); Christian Kloc, New Providence, NJ (US); Vitaly Podzorov, Piscataway, NJ (US)

(73) Assignees: Lucent Technologies Inc., Murray Hill, NJ (US); Rutgers, The State University of New Jersey

( * ) Notice: Subject to any disclaimer, the term of this patent is extended or adjusted under 35 U.S.C. 154(b) by 0 days.

(21) Appl. No.: 11/732,936

(22) Filed: Apr. 4, 2007

(65) Prior Publication Data

US 2007/0181956 A1 Aug. 9, 2007

Related U.S. Application Data

(62) Division of application No. 10/939,713, filed on Sep. 13, 2004, now Pat. No. 7,242,041.

(60) Provisional application No. 60/504,215, filed on Sep. 22, 2003.

(51) Int. Cl.
*H01L 29/10* (2006.01)
*H01L 29/12* (2006.01)

(52) U.S. Cl. ............... 257/43; 257/4; 257/E29.291; 257/E29.294; 257/E21.414; 257/E31.029; 438/158

(58) Field of Classification Search ............ 257/4, 257/43, E29.291, E29.294, E21.414, E31.029; 438/158, FOR. 200, FOR. 183
See application file for complete search history.

(56) References Cited

U.S. PATENT DOCUMENTS

| 6,180,956 | B1 | 1/2001 | Chondroudis et al. ........ 257/40 |
| 2002/0173083 | A1 | 11/2002 | Avouris et al. ............. 438/129 |
| 2003/0170918 | A1 | 9/2003 | Dehaven et al. ............... 438/3 |
| 2004/0178403 | A1* | 9/2004 | Ovshinsky ..................... 257/4 |
| 2005/0009229 | A1 | 1/2005 | Mitzi .......................... 438/95 |
| 2005/0023522 | A1 | 2/2005 | Frey et al. ................... 257/40 |

FOREIGN PATENT DOCUMENTS

WO WO 03/041184 5/2003

OTHER PUBLICATIONS

Matthes, T.W., et al., "Imaging of dopants in surface and sub-surface layers of the transition metal dichalcogenides $WS_2$ and $WSe_2$ by scanning tunneling microscopy," Applied Physics A, vol. 66, pp. S1007-S1011, 1998.

(Continued)

*Primary Examiner*—Matthew Smith
*Assistant Examiner*—Julio J Maldonado
(74) *Attorney, Agent, or Firm*—John F. McCabe

(57) ABSTRACT

A field-effect transistor includes source, drain, and gate electrodes; a crystalline or polycrystalline layer of inorganic semiconductor; and a dielectric layer. The layer of inorganic semiconductor has an active channel portion physically extending from the source electrode to the drain electrode. The inorganic semiconductor has a stack of 2-dimensional layers in which intra-layer bonding forces are covalent and/or ionic. Adjacent ones of the layers are bonded together by forces substantially weaker than covalent and ionic bonding forces. The dielectric layer is interposed between the gate electrode and the layer of inorganic semiconductor material. The gate electrode is configured to control a conductivity of an active channel part of the layer of inorganic semiconductor.

8 Claims, 6 Drawing Sheets

OTHER PUBLICATIONS

PCT International Search Report dated Jan. 19, 2005 for Int'l Appl. No. PCT/US2004/031030.

Mitzi, D.B., et al., "Organic-inorganic elecronics," IBM J. Res. & Dev., vol. 45, No. 1, Jan. 2001, pp. 29-45.

Spah, R., et al., "*pn* junctions in tungsten diselenide," Appl. Phys. Lett. 43 (1), American Institute of Physics, Jul. 1, 1983, pp. 79-81.

Podzorov, V., et al., "Field-effect transistors on rubrene single crystals with parylene gate insulator," Applied Physics Letters, vol. 82, No. 11, Mar. 17, 2003, pp. 1739-1741.

Mitzi, D.B., et al., "High-mobility ultrathin semiconducting films prepared by spin coating," Nature, vol. 428, Mar. 18, 2004, pp. 299-303.

Podzorov, V., et al., "High-mobility field-effect transistors based on transition metal dichalcogenides," Applied Physics Letters, vol. 84, No. 17, Apr. 26, 2004, pp. 3301-3303.

Mitzi, D.B., et al., "Organic-Inorganic Hybrid Thin-Film Transistors," chapter 10 in *Thin-Film Transistors*, eds. C.R. Kagan & P. Audry, Marcel Dekker, Inc., New York-Basel, 2003, pp. 475-513.

Podzorov, V., et al., "Single-crystal organic field effect transistors with the hole mobility ~8$cm^2$/Vs," Applied Physics Letters, vol. 83, No. 17, American Institute of Physics, Oct. 27, 2003, pp. 3504-3506.

Boehme, M. et al., Electronic structure of $WSe_2$ : A combined photoemission and inverse photoemission study, Physical Review B, vol. 55, No. 16, pp. 10 392-10 399, Apr. 15, 1997.

Boscher, N.D. et al., "Atmospheric pressure chemical vapor deposition of $WSe_2$ thin films on glass—highly hydrophobic sticky surfaces," Journal of Materials Chemistry, www.rsc.org /materials, vol. 16, pp. 122-127, 2006.

\* cited by examiner

FIELD-EFFECT TRANSISTORS WITH WEAKLY COUPLED LAYERED INORGANIC SEMICONDUCTORS

This is a divisional of U.S. application Ser. No. 10/939,713, which was filed on Sep. 13, 2004, now U.S. Pat. No. 7,242,041.

This application claims the benefit of U.S. Provisional Application No. 60/504,215, filed on Sep. 22, 2003.

BACKGROUND

1. Field of the Invention

The invention relates to field-effect transistors (FETs) and to methods for fabricating FETs.

2. Discussion of the Related Art

The FET is a very important device in contemporary electronics. In many FETs, the condition of the surface of the semiconductor channel has an important effect on the operation of the FET. In particular, a semiconductor surface and any adjacent dielectric can trap charges. Such trapped charges could reduce the density of mobile charge carriers in the semiconductor. For that reason, high densities of trapped charge densities adversely affect operation of an FET.

Indeed, the conventional fabrication of an inorganic FET often includes a passivation step, which reduces the density of such trapped charges. In silicon FETs, the passivation step includes annealing the silicon surface of the FET's channel in the presence of hydrogen. The hydrogen chemically bonds to dangling bonds from surface silicon atoms thereby neutralizing such dangling bonds as charge traps.

Though the passivation step enables the fabrication of crystalline silicon-based FETs with excellent operating characteristics, crystalline silicon-based FETs have one property that is undesirable for some electronics applications. In particular, crystalline silicon-based FETs are mechanically rigid and are typically fabricated on rigid crystalline substrates. In some applications, it is desirable that the FETs and associated substrate be mechanically flexible. While organic FETs are flexible and have been fabricated on flexible substrates, their operating characteristics are typically substantially inferior to those of crystalline silicon-based FETs. It is desirable to have another type of FET that is mechanically flexible and has operating characteristics superior to those of ordinary organic FETs.

BRIEF SUMMARY

Various embodiments provide inorganic FETs in which the semiconductor channels include a material having anisotropic chemical bonding. Due to the anisotropic chemical bonding, the semiconductor channels have high mobilities and also exhibit mechanical flexibility.

One embodiment features a field-effect transistor. The field-effect transistor includes source, drain, and gate electrodes; a crystalline or polycrystalline layer of inorganic semiconductor; and a dielectric layer. The layer of inorganic semiconductor has an active channel portion physically extending from the source electrode to the drain electrode. The inorganic semiconductor has a stack of 2-dimensional layers in which intra-layer bonding forces are covalent and/or ionic. Adjacent ones of the layers are bonded together by forces substantially weaker than covalent and ionic bonding forces. The dielectric layer is interposed between the gate electrode and the layer of inorganic semiconductor material. The gate electrode is configured to control a conductivity of an active channel part of the layer of inorganic semiconductor.

Another embodiment features a field-effect transistor. The transistor includes source, drain, and gate electrodes; a layer of inorganic semiconductor physically extending between the source electrode and the drain electrode; and a dielectric layer interposed between the gate electrode and the layer of inorganic semiconductor. The inorganic semiconductor includes a compound selected from the group consisting of a metal dichalcogenide, a metal halide, and a bivalent metal hydroxide. The gate electrode is configured to control the conductivity of an active channel part of the layer of inorganic semiconductor.

Another embodiment features a method of fabricating a field-effect transistor. The method includes providing a layer of a crystalline or polycrystalline inorganic semiconductor, forming source and drain electrodes, forming a layer of dielectric, and forming a gate electrode. The semiconductor includes a stack of 2-dimensional layers in which intra-layer bonding forces are covalent and/or ionic. Adjacent ones of the layers are bonded together by van der Waals forces. An active channel portion of the layer of semiconductor extends from the source electrode to the drain electrode. The gate electrode is in contact with the layer of dielectric and is able to change the conductivity of the active channel portion. The layer of dielectric is interposed between the gate electrode and the active channel.

BRIEF DESCRIPTION OF THE DRAWINGS

In the Figures and text, like reference numerals indicate elements with similar functions.

Various embodiments are described more fully by the figures and the following description. The inventions may, however, be embodied in various forms and are not limited to embodiments described in the figures and detailed description.

DETAILED DESCRIPTION OF ILLUSTRATIVE EMBODIMENTS

Figure 1:
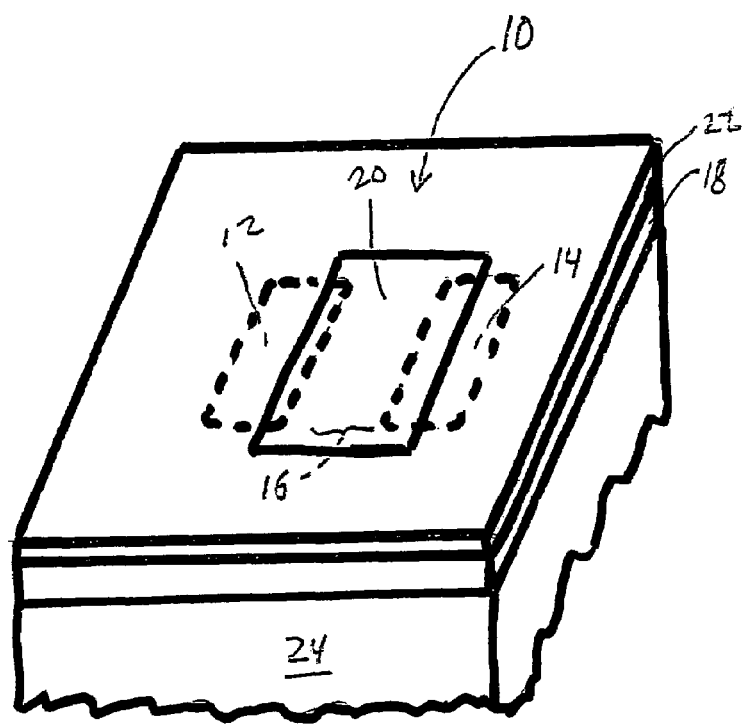
FIG. 1 is a perspective view of a field-effect transistor (FET) whose active channel is an anisotropically bonded inorganic semiconductor.
Figure 2:
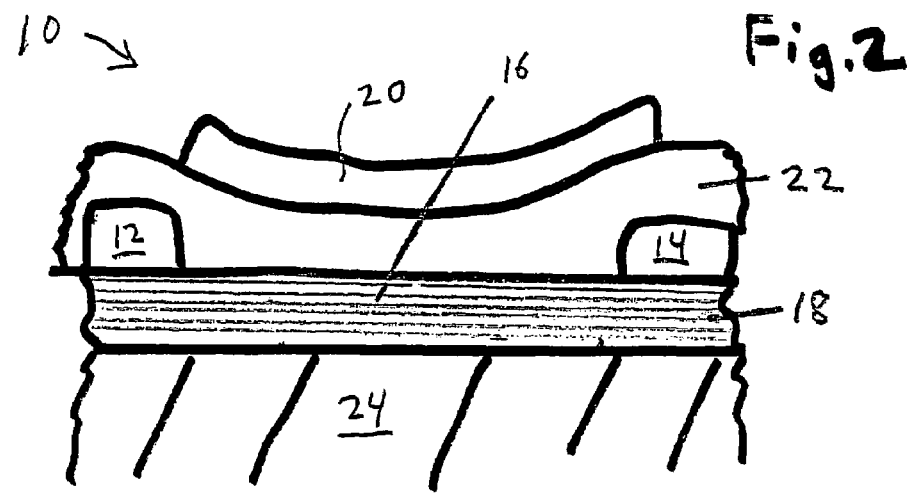
FIG. 2 is a cross-sectional view of the FET of FIG. 1.

FIGS. 1-2 show a field-effect transistor (FET) 10 with an inorganic semiconductor. The FET 10 includes source and drain electrodes 12, 14. Exemplary source and drain electrodes are fabricated of metal, e.g., as silver, gold, copper, or aluminum or of a conductive material such as carbon or heavily doped semiconductor. The source and drain electrodes 12, 14 provide electrical connections to ends of an active semiconductor channel 16. The active semiconductor channel 16 is a portion of a layer 18 of highly anisotropically bonded inorganic semiconductor. The FET 10 also includes a control gate structure, which includes a gate electrode 20 and a gate dielectric layer 22. Exemplary conductors for the gate electrode 20 include conductors listed above for the source and drain electrodes 12, 14. The gate dielectric layer 22 is interposed between the gate electrode 20 and the layer 18 of highly anisotropically bonded inorganic semiconductor. Exemplary gate dielectric layers 22 are formed of inorganic or organic dielectrics, e.g., polymeric dielectrics.

The FET 10 is located on a planar surface of a substrate 24. The substrate 24 may be selected from a variety of dielectric or semiconductor materials. Exemplary materials include silica glass, crystalline silicon, polymers, and plastics. In particular, the highly anisotropically bonded inorganic semiconductor and/or electrodes 12, 14, 20 may be mechanically flexible and need not be fabricated on a crystalline surface. Thus, both the FET 10 and the supporting substrate 24 may be mechanically flexible.

Figure 3:
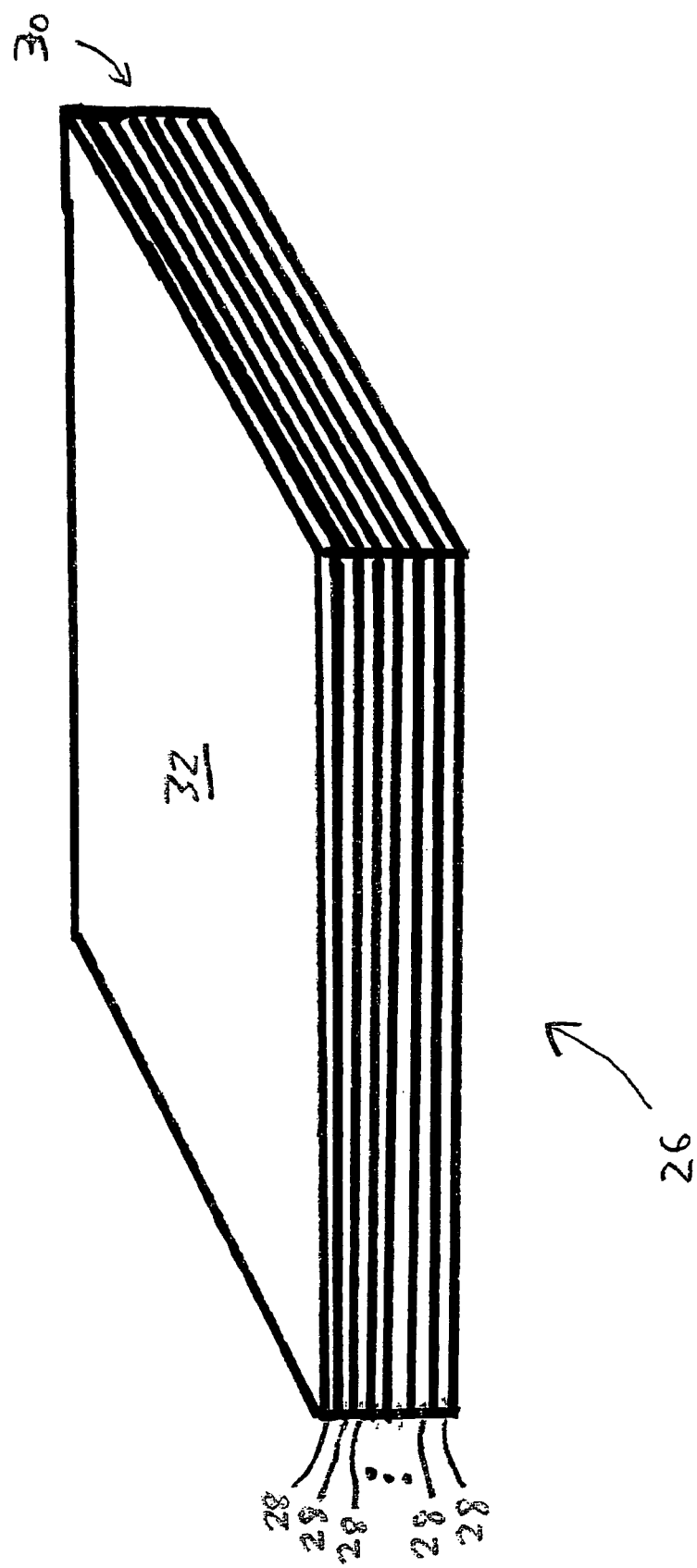
FIG. 3 is an oblique view showing the stack-structure of the semiconductor of the FET of FIGS. 1-2.

Referring to FIG. 3, the semiconductor of the layer 18 of FIGS. 1-2 is a crystalline inorganic material with a highly anisotropic chemical bonding structure. In particular, the crystalline inorganic material is a stack 26 of two-dimensional (2D) sheets 28. The atoms of individual 2D sheets 28 are held together via intra-sheet covalent and/or ion bonds, i.e., strong chemical bonds. Substantially weaker forces, e.g., van der Waals forces, hold adjacent 2D sheets 28 of the stack 26 together. The substantially weaker inter-sheet forces may include isolated covalent/ionic bonding at point defect sites and/or at lateral edges 30 of the 2D sheets 28 or individual crystals. Nevertheless, strong chemical bonding by ionic and/or covalent bonding is substantially absent between adjacent ones of the 2D sheets 28.

One consequence of the substantial absence of inter-sheet covalent or ionic bonding is that the crystalline material of FIG. 3 substantially does not have dangling chemical bonds along the broad top and bottom surfaces 32 of the stack 26, e.g., away from point defects and lateral edges 30. In the FET 10 of FIGS. 1-2, the surfaces 32 of the 2D sheets 28 are oriented along the active channel 16 to ensure that there are substantially no dangling covalent or ionic bonds along the surface 32 of the active channel 16. The absence of dangling bonds substantially eliminates trapped charges at the surface 32 of the active channel 16, i.e., except at point defects on the surface 30 and/or in the dielectric layer 22. Such dangling bonds are one primary source of trapped charges in conventional silicon MOSFETs.

The substantial absence of dangling chemical bonds at surfaces of the layer 18 enable the active channel 16 to have a high charge carrier mobility and a low threshold gate voltage. For example, charge carrier mobilities of $WSe_2$ embodiments of the active channel 16 of the layer 18 are typically orders of magnitude higher than the values of charge carrier mobilities in active channels of organic FETs.

Another consequence of the substantial absence of intersheet covalent or ionic bonding is that the crystalline material of FIG. 3 is typically mechanically flexible. Bending the layer 18 of the crystalline semiconductor of FIGS. 1-2 typically does not cause damage, because the very weak bonding between stacked 2D layers 28 of the stack 26 of FIG. 3 enables the 2D layers 28 to slide over each other when the layer 18 is bent. For that reason, the FET 10 of FIGS. 1-2 can be mechanically flexible provided that the substrate 24, dielectric layer 22, and electrodes 12, 14, 20 are also made of flexible materials.

Several classes provide candidates for the highly anisotropically bonded semiconductor of the layer 18 in FIGS. 1-2. The classes include transition metal dichalcogenides, some nontransition metal dichalcogenides, metal halides, and bivalent metal hydroxides.

The transition metal dichalcogenides have the general formula $TX_2$ where T is a transition metal and X is a chalcogenide, e.g., selenium (Se), sulfur (S), or tellurium (Te). Exemplary transition metal dichalcogenides include $MoSe_2$, $HfS_2$, and $WSe_2$. Here, Mo, Hf, and W are molybdenum, hafnium, and tungsten, respectively.

The nontransition metal dichalcogenides have the general formula $MX_2$ where M is a metal and X is a chalcogenide. An example of a nontransition metal dichalcogenide is $SnSe_2$. Here, Sn is tin.

The metal halides have the formula $MY_2$ or $MY_3$ where M is a metal and Y is a halide, e.g., chlorine, bromine, or iodine. Exemplary metal halides include $CdCl_2$, $CdI_2$, $PbI_2$, $SbI_3$, and $CrCl_3$. Here, Cd, Pb, Sb, and Cr are cadmium, lead, antimony, and chromium, respectively. Some of the metal halides may be less desirable for FETs, e.g., because they are adversely affected by the humidity in ordinary air.

The bivalent metal hydroxides have the general formula $M(OH)_2$ where M is a bivalent metal and (OH) is the hydroxide functional group. Exemplary bivalent metal hydroxides include $Cu(OH)_2$, $Ni(OH)_2$, and $Zn(OH)_2$. Here, Cu, Ni, and Zn are copper, nickel, and zinc, respectively.

Figure 4:
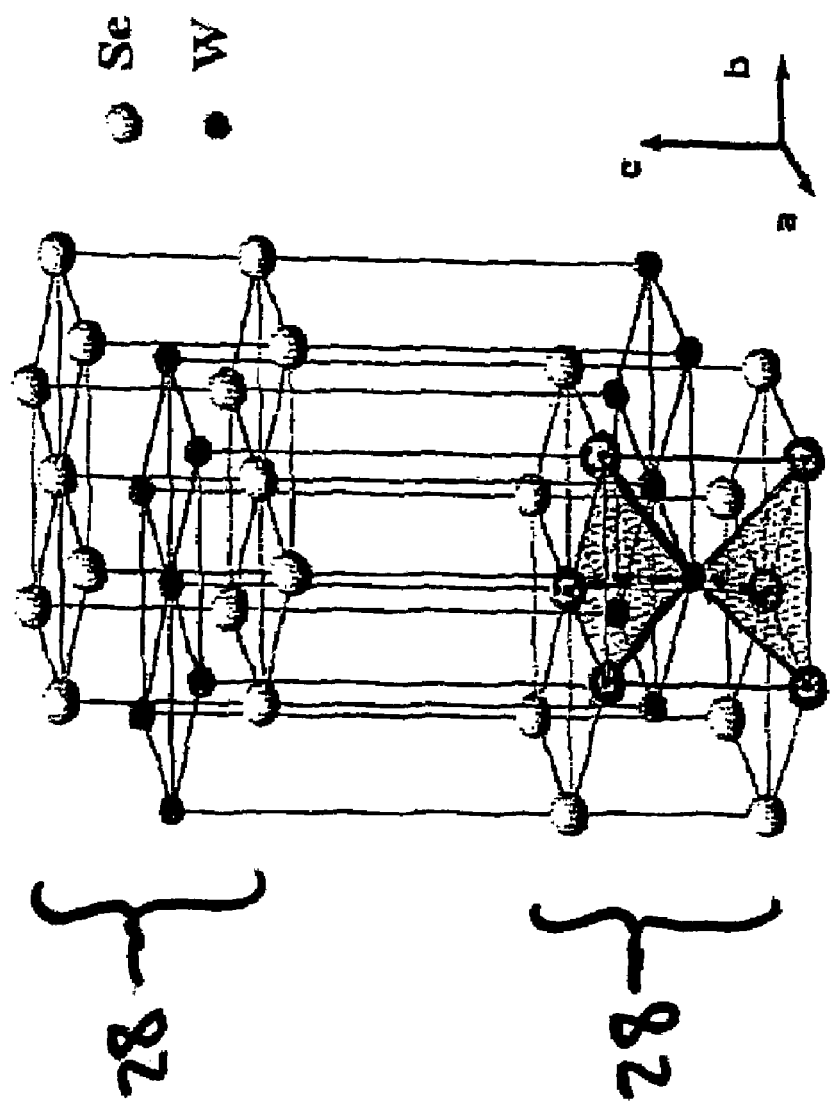
FIG. 4 illustrates the atomic structure in one exemplary semiconductor for the FET of FIGS. 1-2.

FIG. 4 illustrates the crystalline structure of $WSe_2$ by showing the relative placement of W and Se atoms in two adjacent layers 28 of the stack 26 of FIG. 3. Within one layer 28, each W atom and the adjacent six Se atoms form a pair of trigonal prisms. W and Se atoms of a trigonal prism are covalently/ionically bonded together. In contrast, Se atoms of adjacent layers along the c lattice direction are only bound together by weak van der Waals forces.

Figure 5:
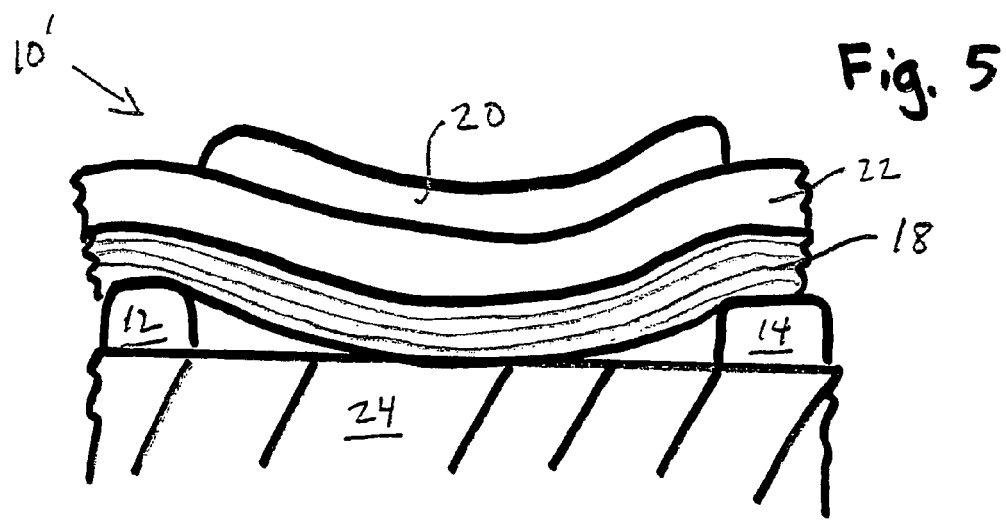
FIG. 5 is a cross-sectional view of another embodiment of an FET whose active channel is an anisotropically bonded inorganic semiconductor.
Figure 6:
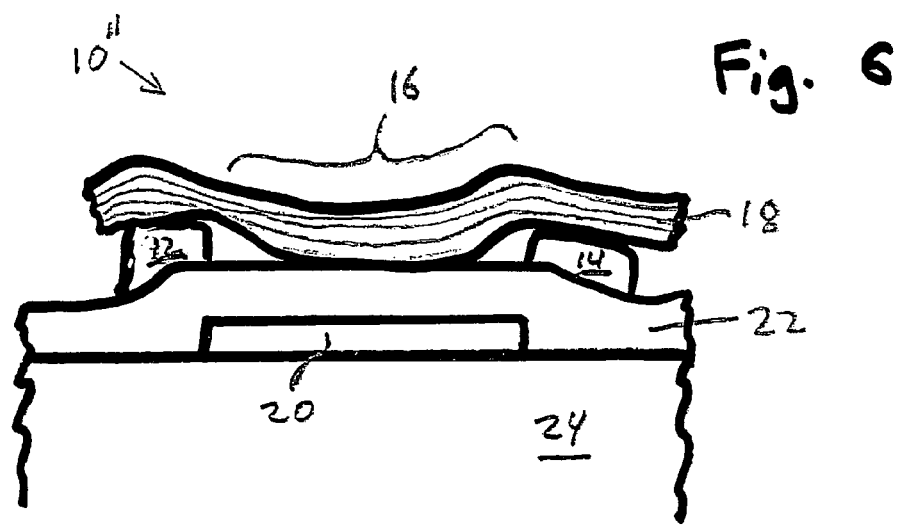
FIG. 6 is a cross-sectional view of a third embodiment of an FET whose active channel is an anisotropically bonded inorganic semiconductor.

FIGS. 5 and 6 illustrate alternate embodiments of FETs 10', 10". In the FET 10', the gate structures 20, 22 and source/drain electrodes 12, 14 are on opposite sides of the layer 18 of highly anisotropically bonded inorganic semiconductor. In the FET 10", the gate 20 and the gate dielectric layer 22 are located on substrate 24 whereas the source/drain electrodes 12, 14 and the layer 18 of highly anisotropically bonded inorganic semiconductor are located over the gate dielectric 22.

Figure 7:
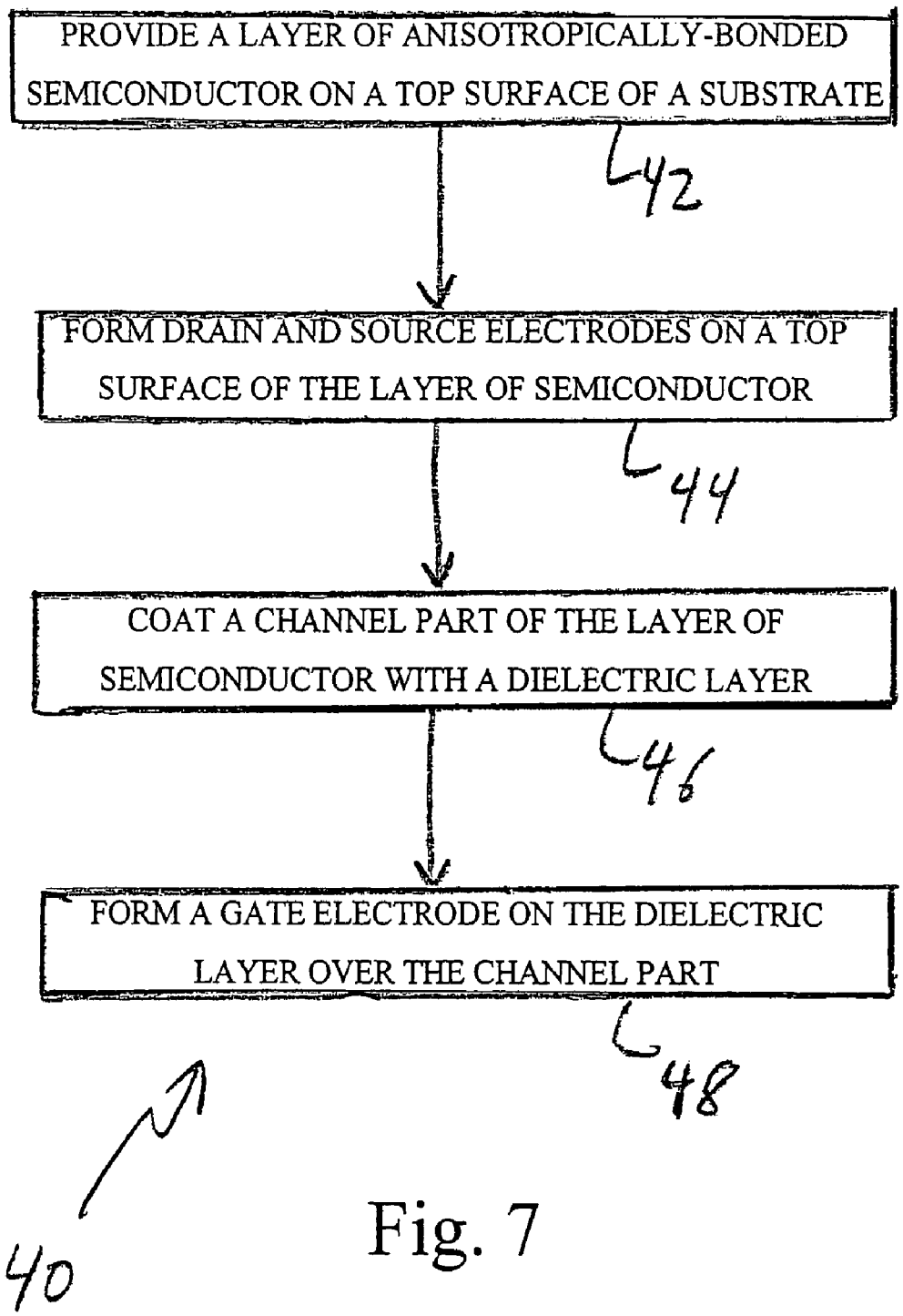
FIG. 7 is a flow chart for a method of fabricating FETs with anisotropically-bonded inorganic semiconductors, e.g., the FETs of FIGS. 1 and 2.

FIG. 7 illustrates a method 40 of fabricating a FET with a layer of highly anisotropically bonded inorganic semiconductor, e.g., as show in FIGS. 1-2.

The method 40 includes providing a thin layer of an anisotropically bonded semiconductor on a planar top surface of a dielectric or semiconductor substrate (step 42). The layer of semiconductor is formed of one of the above-described materials, e.g., a transition metal dichalcogenide, a metal dichalcogenide, a metal halide, or a bivalent metal hydroxide. The thin layer of anisotropically bonded semiconductor may, for example, have only a few 2D sheets therein or may have many of said 2D sheets. The semiconductor layer is crystalline or polycrystalline and is oriented so that its 2D sheets are stacked along a direction perpendicular to the top surface of the substrate. For the exemplary the semiconductor $WSe_2$, the atomically flat (a, b) could, e.g., be in contact with the planar top surface of the substrate.

The providing step may involve growing a whole crystal of the semiconductor in a separate environment and then, placing the whole crystal on the top surface of the substrate. Alternately, the providing step involves directly depositing or growing a thin crystalline or polycrystalline film of the semiconductor on the top surface of the substrate via a suitable conventional thin film deposition process.

For $WSe_2$ crystals, an exemplary growth process involves the following steps. First, W powder and Se shot are mixed in a precise stoichiometric ratio of 1:2. Next, the W and Se mixture is placed in an ampoule, which is sealed under a vacuum. Next, the sealed ampoule is slowly heated from room temperature to about 1,000° C. Raising the temperature to 1,000° C. may, e.g., take two days. The heating produces a mixture of solid W and liquid Se. Plate-like crystals of $WSe_2$ grow on the surface of the heated mixture of W and Se. Then, the ampoule is slowly cooled, and a whole crystal of WeSe$_2$ is removed from the ampoule for placement on the top surface of a substrate for the FET.

Another process for fabricating WSe$_2$ crystals involves the following steps. First, purified W powder is obtained via a multi-step process. In that process, WO$_3$ is repeatedly sublimed in a closed tube at about 800° C. Each sublimation produces a purified yellowish WO$_3$ powder and leaves an impurity residue at the sublimation source. The sublimation-purified WO$_3$ is subjected to flowing H$_2$ gas at atmospheric pressure and at a temperature of about 800° C. The H$_2$ reduces the WO$_3$ powder to a grayish powder of purified W in which the molar ratio of impurities to W can be less than about $10^{-5}$. In addition, the W can be further purified by float zoning in high vacuum to boil off impurities. Next, the solid W is reacted with Se in a closed quartz tube at about 925° C. to produce a product. The product is transported over a temperature gradient of about 2° C. per centimeter. In a cooler region of the gradient plate-like crystals of WSe$_2$ will form. After cooling the tube, a whole crystal of WeSe$_2$ is removed for placement on the top surface of a substrate for the FET.

The method 40 also includes forming drain and source electrodes on a top surface of the above-provided layer of anisotropically bonded semiconductor (step 44). The forming step may include a mask-controlled evaporation-deposition of a film of a metal such as gold or silver onto the surface of the layer of anisotropically bonded semiconductor. Alternately, the forming step may include painting a colloidal suspension of conductive particles, e.g., carbon particles, onto the surface of the layer of semiconductor and then, evaporating away the solvent to produce the conducting source and drain electrodes thereon.

The method 40 also includes coating a channel portion of the layer of anisotropically bonded semiconductor with an inorganic or organic dielectric layer, i.e., a gate dielectric (step 46). The coating step may, e.g., involve either performing a mask-controlled deposition onto the semiconductor of dielectric or spin coating dielectric onto the semiconductor. An exemplary coating step involves forming a conformal polymeric coating of parylene on the layer of semiconductor. For example, the parylene layer may have a thickness of about 1 μm. As is well-known, a physical transport process can produce such a parylene layer under room temperature conditions. The physical transport process involves vaporizing dimers of para-xylylene at about 100° C., cleaving the dimers in a separate pyrolysis zone at a temperature of about 700° C., and then, transporting the cleaved dimers to the layer of semiconductor where polymerization forms the parylene layer at room temperature.

The method 30 also includes forming a gate electrode on the dielectric layer, wherein the gate electrode is aligned to be over the channel part of the layer of semiconductor (step 48). The forming step for the gate electrode involves either an evaporation-deposition of metal or a painting of a colloidal suspension of conducting particles onto the semiconductor layer, i.e., via processes described above for the formation of the source and drain electrodes.

Various embodiments of the FETs 10, 10', 10" of FIGS. 1-2 and 5-6 function as Schottky type transistors in which carrier are injected from the electrodes 12, 14 into the active channel 16. Various configurations of the symmetric single channel FETs 10, 10', 10" display ambivalent carrier behavior, i.e., conduction where majority charge carriers are holes and also conduction where majority charge carriers are electrons. If the active channel is the transition metal dichalcogenide WSe$_2$, ambivalent behavior is observed, because the gate voltage is able to change the sign of the band bending at the source/drain electrodes.

Figure 8:
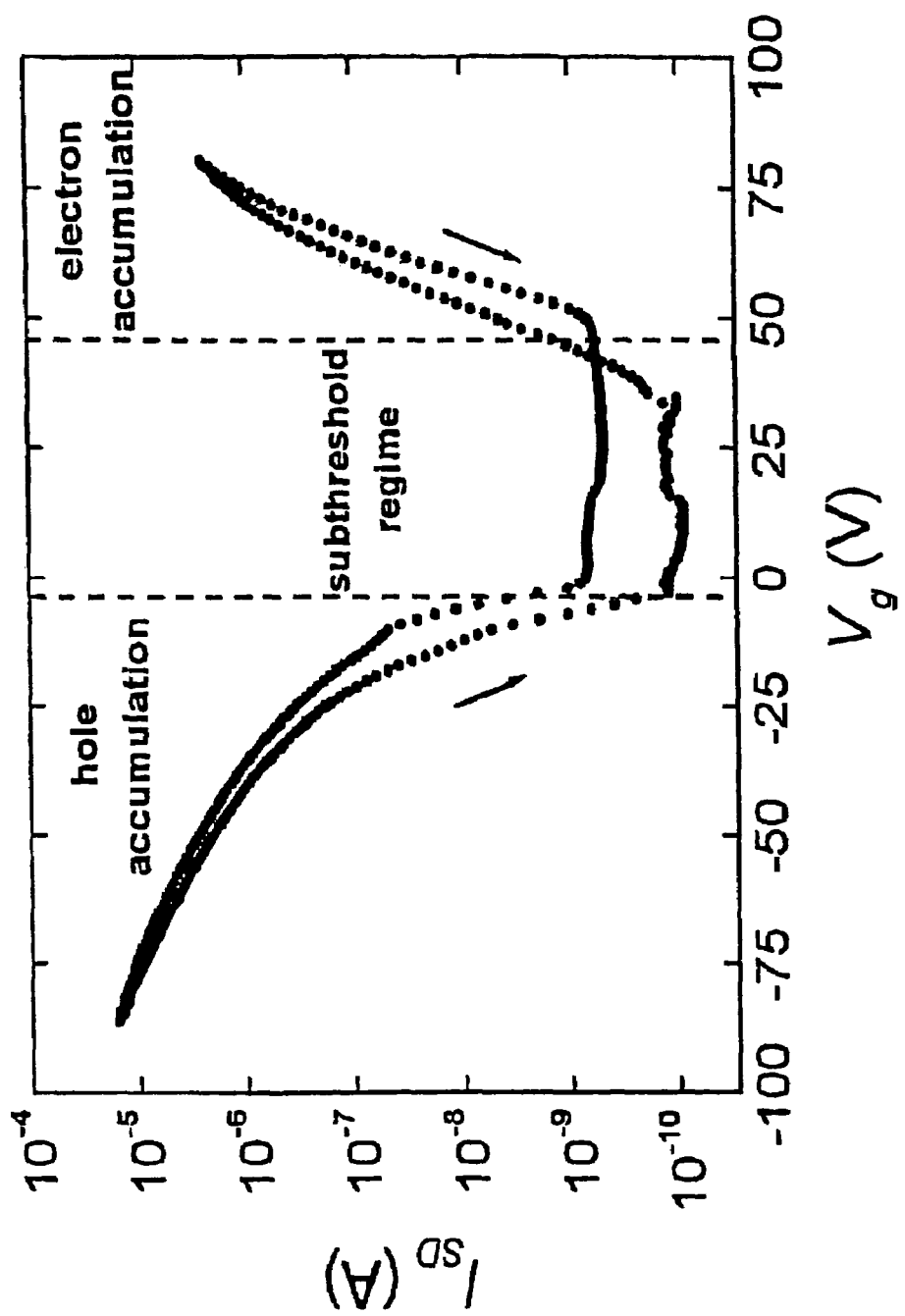
FIG. 8 plots the source-drain current as a function of gate voltage for a $WSe_2$-based embodiment of the FET of FIGS. 1-2 as measured at 60° Kelvin.

FIG. 8 plots measured source-drain currents $I_SD$ in amperes (A) as a function of the gate voltage, $V_g$, in volts (V) for an embodiment of one such WSe$_2$-based FET as measured at about 60° Kelvin. The two separate paths of measured data point result from hysteresis effects. The measured data points show that the WSe$_2$-based FET conducts for both positive and negative applied gate potentials, i.e., both electron and hole charge carriers. At room temperature, the WSe$_2$-based FET had an intrinsic mobility of about 100 cm$^2$/(V-seconds) to 500 cm$^2$/(V-seconds). Based on two-probe geometries, measurements produce apparent lower values for the mobility, i.e., mobilities of up to about 100 cm$^2$/(V-seconds) due to a substantial contact resistance between the measurement probes and semiconductor.

The measured WSe$_2$-based FET had a higher ON/OFF ratio for the source-drain current when operated at low temperatures, e.g., 60° Kelvin, than when operated at room temperature. The higher low-temperature values of the ON/OFF ratio resulted from the FET's semiconductor having a lower bulk conductivity at low temperatures. The relatively higher bulk conductivity at room temperature probably resulted from unintentional p-type doping of the WSe$_2$ semiconductor. Such doping occurs when the molar ratio of W to Se in the semiconductor is different from 1:2.

Unintentional doping of an anisotropically bonded semiconductor, e.g., WSe$_2$, probably results from errors in stoichiometric ratios of constituent elements, e.g., W and Se, during the formation of the semiconductor. Formation methods that reduce such unintentional doping should produce higher ON/OFF ratios for the FET's source-drain current at room temperature.

From the disclosure, drawings, and claims, other embodiments of the invention will be apparent to those skilled in the art.

What we claim is:

1. An apparatus, comprising:
   a field-effect transistor, the transistor comprising:
      source, drain, and gate electrodes;
      an inorganic semiconductor layer, a portion of the layer physically connecting the source electrode and the drain electrode; and
      a dielectric layer interposed between the gate electrode and the inorganic semiconductor layer, the gate electrode being configured to control a conductivity of an active channel part of the inorganic semiconductor layer; and
      wherein the inorganic semiconductor layer comprises a metal halide or a bivalent metal hydroxide.

2. The apparatus of claim 1, further comprising:
   a non-crystalline and mechanically flexible substrate, the field effect transistor being located on the substrate.

3. The apparatus of claim 2, wherein the substrate is a material that includes a plastic or a polymer.

4. The apparatus of claim 1, wherein the inorganic semiconductor layer is crystalline.

5. The apparatus of claim 1, wherein the inorganic semiconductor layer comprises a metal halide.

6. The apparatus of claim of claim 5, further comprising:
   a non-crystalline and mechanically flexible substrate, the field effect transistor being located on the substrate.

7. The apparatus of claim 1, wherein the inorganic semiconductor layer comprises a bivalent metal hydroxide.

8. The apparatus of claim 7, further comprising:
   a non-crystalline and mechanically flexible substrate, the field effect transistor being located on the substrate.

* * * * *